(12) United States Patent
Ahlgren

(10) Patent No.: US 8,507,110 B2
(45) Date of Patent: Aug. 13, 2013

(54) COATED CUTTING TOOL AND A METHOD OF MAKING THEREOF

(75) Inventor: Mats Ahlgren, Täby (SE)

(73) Assignee: Sandvik Intellectual Property AB, Sandviken (SE)

( * ) Notice: Subject to any disclaimer, the term of this patent is extended or adjusted under 35 U.S.C. 154(b) by 178 days.

(21) Appl. No.: 12/991,613

(22) PCT Filed: Apr. 17, 2009

(86) PCT No.: PCT/SE2009/050395
§ 371 (c)(1),
(2), (4) Date: Apr. 1, 2011

(87) PCT Pub. No.: WO2009/128782
PCT Pub. Date: Oct. 22, 2009

(65) Prior Publication Data
US 2011/0188950 A1    Aug. 4, 2011

(30) Foreign Application Priority Data

Apr. 18, 2008  (WO) .................. PCT/SE2008/050442
Oct. 17, 2008  (SE) ....................... 0802219

(51) Int. Cl.
*B32B 9/00* (2006.01)

(52) U.S. Cl.
USPC ............ 428/697; 51/307; 51/309; 204/192.1; 204/192.12; 204/192.15; 204/192.16; 428/469; 428/472; 428/698; 428/699

(58) Field of Classification Search
USPC ................... 51/307, 309; 428/469, 472, 697, 428/698, 699; 204/192.1, 192.12, 192.15, 204/192.16
See application file for complete search history.

(56) References Cited

U.S. PATENT DOCUMENTS

| | | | |
|---|---|---|---|
| 7,527,457 B2 * | 5/2009 | Moriguchi et al. | 51/307 |
| 7,592,076 B2 * | 9/2009 | Flink et al. | 428/697 |
| 7,732,066 B2 * | 6/2010 | Fukui et al. | 428/698 |
| 7,939,172 B2 * | 5/2011 | Gorokhovsky et al. | 428/446 |
| 8,105,966 B2 * | 1/2012 | Dahl et al. | 501/96.4 |
| 8,247,092 B2 * | 8/2012 | Hedin et al. | 204/192.15 |
| 2007/0284255 A1 | 12/2007 | Gorokhovsky et al. | |

FOREIGN PATENT DOCUMENTS

| | | |
|---|---|---|
| EP | 1 726 390 | 11/2006 |
| EP | 1988190 A2 | 11/2008 |
| JP | 08-118106 * | 5/1996 |
| JP | 2002-337002 * | 11/2002 |
| JP | 2004-66361 | 3/2004 |

(Continued)

OTHER PUBLICATIONS

European Search Report for Application 09732164.0, dated Dec. 16, 2011.

(Continued)

*Primary Examiner* — Archene Turner
(74) *Attorney, Agent, or Firm* — Morgan, Lewis & Bockius LLP

(57) ABSTRACT

The present invention relates to a cutting tool for metal machining with improved wear properties, comprising a cutting tool substrate of cemented carbide, cermet, ceramics or a super hard material, and a wear resistant coating, wherein the wear resistant coating comprises a PVD Ti—Si—C—N layer with a compositional gradient, and a method of making thereof.

16 Claims, 2 Drawing Sheets

(56) References Cited

FOREIGN PATENT DOCUMENTS

Figure 1:
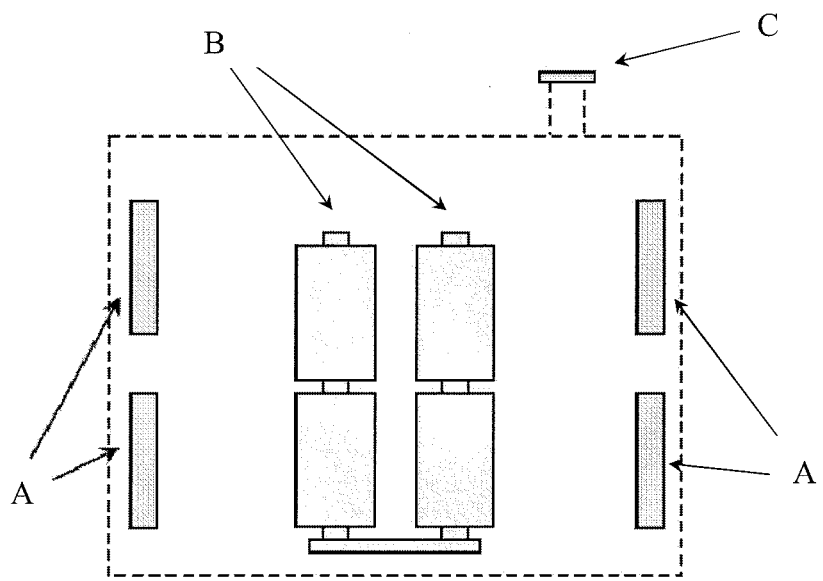

| | | |
|---|---|---|
| JP | 2004-74361 | 3/2004 |
| JP | 2004-114219 | 4/2004 |
| JP | 2005-262388 | 9/2005 |
| WO | 2008/130316 | 10/2008 |

OTHER PUBLICATIONS

Search Report dated Jul. 10, 2009 for International Application No. PCT/SE2009/050395 filed Apr. 17, 2009.

H. Xu et al., "Tribological behavior of a TiSiCN coating tested in air and coolant," Surface & Coatings Technology, vol. 201 (2006) pp. 4236-4241.

Dayan Ma et al., "Microstructure and tribological behaviour of superhard Ti-Si-C-N nanocomposite coatings deposited by plasma enhanced chemical vapour deposition," Thin Solid Films, vol. 496 (2006) pp. 438-444.

Dayan Ma et al., "Superhard nanocomposite Ti-Si-C-N coatings prepared by pulsed-d.c plasma enhanced CVD," Surface & Coatings Technology, vol. 200 (2005) pp. 382-386.

Jun-Ha Jeon et al, "Synthesis and characterization of quaternary Ti-Si-C-N coatings prepared by a hybrid deposition technique," Surface & Coatings Technology, vol. 188-189 (2004) pp. 415-419.

Ismail C. Noyan et al., "Residual Stress Measurement by Diffraction and Interpretation," New York: Springer-Verlag, 1987, pp. 117-130.

\* cited by examiner

COATED CUTTING TOOL AND A METHOD OF MAKING THEREOF

CROSS REFERENCE TO RELATED APPLICATIONS

This application is the National Stage of International Application No. PCT/SE2009/050395, filed Apr. 17, 2009, and claims benefit of International Application No. PCT/SE2008/050442 filed Apr. 18, 2008 and Swedish Application No. 0802219-6 filed Oct. 17, 2008.

BACKGROUND OF THE INVENTION

The present invention relates to a coated cutting tool with a wear resistant coating comprising the quarternary alloy Ti—Si—C—N, deposited by physical vapour deposition.

Modern high productivity chip forming machining of metals requires reliable tools with high wear resistance, good toughness properties and excellent resistance to plastic deformation. This has so far been achieved by applying a suitable coating to the surface of a tool substrate. As a result, the tool may be used at considerably higher cutting speed and feed. The coating is preferably hard, wear resistant and stable at high temperatures. The tool substrate is generally in the shape of an insert, for clamping in a tool holder, but can also be in the form of a solid drill or a milling cutter.

Cutting tools are generally optimized for a particular application area, defined by the special requirements on the tool, such as high resistance to crater wear, high resistance to flank wear etc. It is, however, desirable to extend the field of application by improving one or several properties without loss in other properties.

Physical Vapour Deposition (PVD) is a technology known for thin film growth of stable compounds. In the metal cutting industry PVD coatings including layers such as TiN, Ti(C,N) and (Ti,Al)N are among the most common. Evaporation of metal from targets is accomplished by electrical arc or ion bombardment in a reactive gas containing nitrogen or carbon. Very often the targets have the same metal composition as the final layer.

Ma et al. (Thin Solid Films 496 (2006), pp 438-444) and (Surface & Coatings Technology 200 (2005), pp 382 386) disclose depositing Ti—Si—C—N coatings onto high speed steel substrates using plasma enhanced chemical vapour deposition from $TiCl_4/SiCl_4/H_2/N_2/CH_2/Ar$ mixtures, wherein particularly the hardness behaviour of the deposited coating is evaluated.

Jeon et al. (Surface and Coatings Technology 188-189 (2004), pp 415-419) discloses Ti—Si—C—N coatings deposited on WC—Co substrates by a hybrid system combining the arc ion plating (AIP) and DC magnetron sputtering techniques using Ti and Si targets in an $Ar/N_2/CH_4$ gaseous mixture.

H. Xu et al. (Surface & Coatings Technology 201, 2006, pp 4236-4241) discloses deposition of a thick Ti—Si—C—N coating onto a stainless steel substrate in a plasma enhanced magnetron sputtering process using trimethylsilane. A 17 μm thick Ti—Si—C—N coating was fabricated and pin-on-disc tests were conducted in order to evaluate the tribological properties with aluminium and alumina counterparts.

It is an object of the present invention to provide a PVD coated cutting tool for chip forming machining having improved resistance to crater wear, without loss in resistance to flank wear.

THE INVENTION

The present invention provides a cutting tool for metal machining comprising a cutting tool substrate of cemented carbide, cermet, ceramics or a super hard material, such as cubic boron nitride or diamond, and a wear resistant coating, wherein the wear resistant coating comprises a PVD Ti—Si—C—N layer with a compositional gradient.

The present invention also provides a method of making a cutting tool for metal machining wherein the method comprises depositing onto a cutting tool substrate of cemented carbide, cermet, ceramics or a super hard material, a PVD Ti—Si—C—N layer with a compositional gradient using arc evaporation with one or more Ti targets and a reactive gas atmosphere comprising a flow of trimethylsilane gas, and continuously or incrementally changing the flow of the trimethylsilane gas during the deposition.

The thickness of the PVD Ti—Si—C—N layer is suitably in a range common for PVD functional layers for metal cutting tools, i.e., 1 to 10 μm, preferably 2 to 7 μm, most preferably 2 to 5 μm.

The coating may include further layers such as, e.g., a thin bonding layer between the substrate and the PVD Ti—Si—C—N layer, e.g., TiN.

The coating may also include an outermost layer for wear detection or colouring purposes, e.g., TiN.

Suitably the total thickness of the deposited coating is less than 11 μm, preferably less than 8 μm, to avoid spalling.

The average composition of the Ti—Si—C—N layer, when seen as Si in relation to Ti, i.e., the average Si/(Si+Ti) atomic ratio as measured over the total thickness of the Ti—Si—C—N layer, is suitably 0.03 to 0.20, preferably 0.045 to 0.18, more preferably 0.05 to 0.15, most preferably 0.06 to 0.14. It has been found that lower ratios may result in loss in flank wear resistance, whereas higher ratios may result in a too brittle layer leading to loss in crater wear resistance. The layer may, however, locally have a Si/(Si+Ti) atomic ratio of >=0, preferably >0, but preferably less than 0.25 to avoid non-dense layers being formed.

The average composition with regards to C in relation to N, i.e., the average C/(C+N) atomic ratio as measured over the total thickness of the layer, is suitably 0.05 to 0.20, preferably 0.10 to 0.20, more preferably 0.10 to 0.18. It has been found that below these values a decrease in hardness may be obtained leading to unacceptable flank wear resistance. Too high C content, on the other hand, may result in a too high residual compressive stress level and inferior cutting performance. The layer may, however, locally have a C/(C+N) atomic ratio>=0, preferably >0, but preferably less than 0.23 to avoid free C being formed.

It is also preferred that the residual stress of the Ti—Si—C—N layer, measured in the (220)-direction, is from −3.0 GPa (compressive stress) up to +0.5 GPa (tensile stress), preferably up to −1.0 GPa (compressive stress).

The hardness of the described Ti—Si—C—N coating is in the range of 20 to 40 GPa. It has been found, however, that it is not possible to predict the performance in metal machining by studying the coating hardness. Results show that an increased hardness of the coating does not automatically lead to an increased wear resistance.

In one embodiment of the present invention said PVD Ti—Si—C—N layer has an average Si/(Si+Ti) atomic ratio of 0.05 to 0.15, and a residual stress, measured in the (220)-direction, of −3.0 GPa (compressive stress) up to +0.5 GPa (tensile stress), preferably −1.0 GPa (compressive stress).

In one embodiment of the invention the compositional gradient is continuous and such that the Si/(Si+Ti) atomic ratio increases in the direction from the inner part of the layer towards the outer part of the layer. Suitably the Si/(Si+Ti) atomic ratio increases at least 0.01 per μm, preferably at least 0.015 per μm.

In one embodiment of the invention the compositional gradient is continuous and such that the Si/(Si+Ti) atomic ratio decreases in the direction from the inner part of the layer towards the outer part of the layer. Suitably the Si/(Si+Ti) atomic ratio decreases at least 0.01 per μm, preferably at least 0.015 per μm.

In one embodiment of the invention the compositional gradient is incremental wherein the Si/(Si+Ti) atomic ratio incrementally increased, or decreased in the layer, thus, having a successive change of the average composition of the Ti—Si—C—N layer. Suitably the incremental change in Si/(Si+Ti) atomic ratio in each incremental step is within >0 up to 0.02, preferably >0 up to 0.01.

In one embodiment of the invention the compositional gradient is incremental wherein the Ti—Si—C—N layer comprises at least two alternating sublayers having different Si/(Si+Ti) atomic ratio. The gradient is obtained by successively increasing, or decreasing, the Si/(Si+Ti) atomic ratio of at least one of said alternating sublayers. Suitably the thickness of said alternating sublayers is 1 to 100 nm.

In one embodiment of the invention the compositional gradient is incremental wherein the Ti—Si—C—N layer comprises at least two alternating sublayers having different Si/(Si+Ti) atomic ratio. The gradient is obtained by successively increasing, or decreasing, the thickness of at least one of said alternating sublayers. Suitably the thickness of said alternating sublayers is 1 to 100 nm.

In one embodiment of the invention the compositional gradient is incremental wherein the Ti—Si—C—N layer comprises two alternating sublayers, c and d, having different Si/(Si+Ti) atomic ratio. The gradient is obtained by successively increasing the Si/(Si+Ti) atomic ratio or the thickness of sublayer c or d, or decreasing the Si/(Si+Ti) atomic ratio or the thickness of sublayer c or d. Suitably said sublayers c and d have an average Si/(Si+Ti) atomic ratio of >0 to 0.07 and >0.07 to 0.20, respectively.

In a preferred embodiment the substrate is of cemented carbide, i.e., a composite having WC as a main hard phase component and a Co based binder phase.

Suitably the metal cutting tools according to the invention are milling, turning, drilling or threading inserts, for clamping in a tool holder, but can also be in the form of a solid drill, a milling cutter or a threading tap.

The method of making a cutting tool according to the present invention comprises depositing the PVD Ti—Si—C—N layer, with the ability to control the incorporation of silicon content on a continuous scale and the ability to control the residual stress of the described Ti—Si—C—N layer on a continuous scale, onto a substrate of cemented carbide, cermet, ceramic or a super hard material, such as cubic boron nitride or diamond, preferably cemented carbide, by PVD arc evaporation technique.

In the arc evaporation process, for depositing the Ti—Si—C—N layer, one or more targets of Ti are used together with the addition of trimethylsilane gas, $(CH_3)_3SiH$, to the reaction gas atmosphere, at a flow controlled by a mass flow controller. As an important feature this procedure corresponds to being able to continuously control the material composition of the deposited coatings, specifically the Si concentration, and still making use of the benefits of the mentioned arc evaporation process, and creating a compositional gradient by continuously or incrementally changing the flow of the trimethylsilane gas during the deposition.

FIG. 1 shows schematically an exemplary target configuration of an arc evaporation equipment used for making a coated cutting tool according to the present invention, in which A) Titanium targets; B) Substrate holders; C) Vacuum system, gas inlet.

Figure 2:
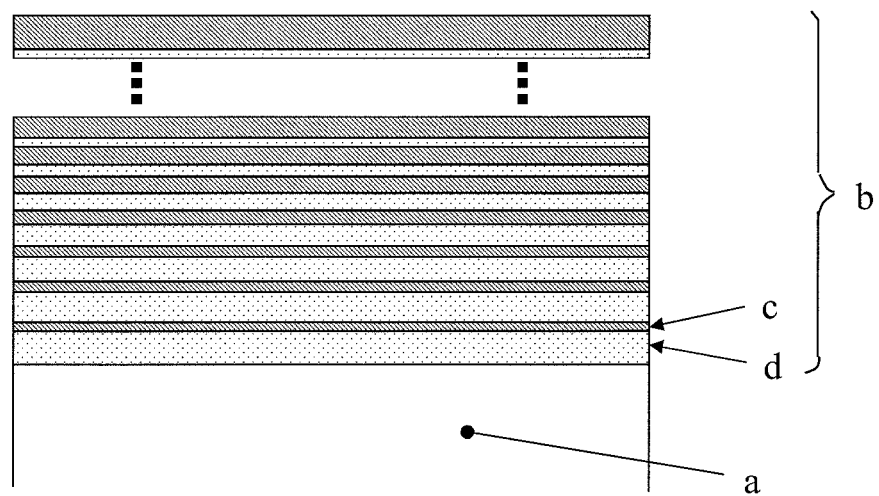

FIG. 2 is a schematic representation of a cross section taken through an exemplary coated cutting tool of the present invention showing a showing a substrate, a, coated with a Ti—Si—C—N layer, b, comprising two alternating sublayers, c and d, having different Si/(Si+Ti) atomic ratio.

Figure 3:
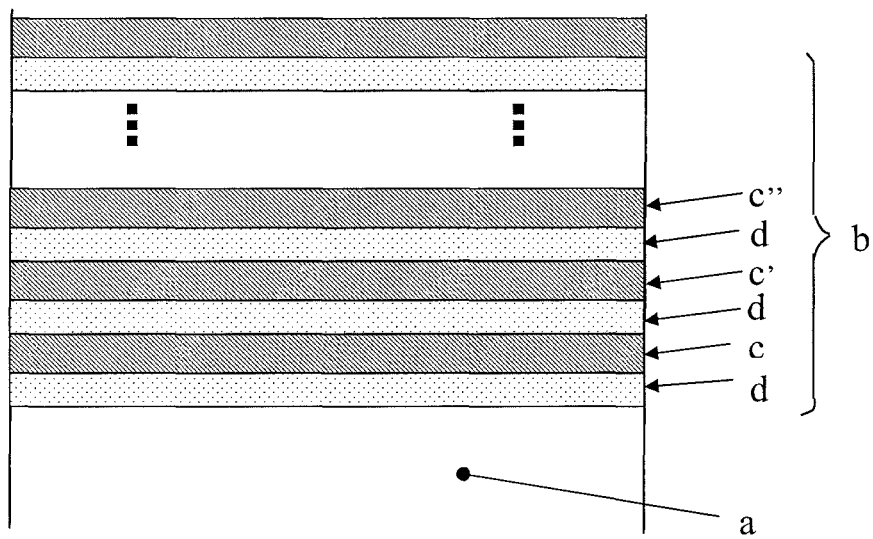

FIG. 3 is a schematic representation of a cross section taken through an exemplary coated cutting tool of the present invention showing a substrate, a, coated with a Ti—Si—C—N layer, b, comprising two alternating sublayers, c and d, having different Si/(Si+Ti) atomic ratio, where sublayer c has a successively increasing Si/(Si+Ti) atomic ratio in the direction from the inner part of the Ti—Si—C—N layer towards the outer part of the layer (c', c'').

It is preferred that the added trimethylsilane gas is the sole source of Si in the deposition process.

The deposition process is suitably performed at substrate temperatures between 400 to 600° C. The base pressure prior to deposition is preferably <50 pPa and the Ar sputtering gas flow is suitably in the range 0 to 500 sccm. The reactive gas such as $N_2$ and trimethylsilane is let in through a common inlet or through separate inlets. The $N_2$ flow is suitably in the range of 500 to 1000 sccm.

By varying the trimethylsilane gas flow during the deposition it is possible to control the composition of the resulting coating, with regards to Si and C content. The method allows for having a trimethylsilane flow of zero, i.e., resulting in a Si and C content in the layer locally being zero. The upper limit of the trimethylsilane flow is suitably about 25% (sccm) of the $N_2$ flow.

The substrates are connected by a potential difference to the deposition chamber wall, this potential is referred to as the substrate bias. The substrate bias is suitably in the range of −50 to −150 V. The residual stress of the resulting coating can be controlled by varying the substrate bias; by an increase in the substrate bias the residual compressive stress is increased. It has surprisingly been found that it is also possible to control the residual stress of the resulting coating by varying the Si content; by a decrease in Si content the residual compressive stress is increased. By using the method according to the invention it is, thus, possible to obtain a comparatively high Si content while simultaneously maintaining the compressive residual stress at a moderate level, i.e. avoiding an excessive compressive residual stress at which spontaneous flaking of the coating appears. This is an advantage compared to prior art systems using TiSi targets as the sole Si source, for which in order to obtain a dense layer an increased substrate bias is required, resulting in an increased compressive residual stress level where spontaneous flaking becomes a problem.

In one embodiment of the invention the compositional gradient in the Ti—Si—C—N layer is continuous such that the Si/(Si+Ti) atomic ratio increases continuously in the direction from the inner part of the layer towards the outer part of the layer, which is obtained by continuously increasing the trimethylsilane flow during the deposition. Suitably the Si/(Si+Ti) atomic ratio increases at least 0.01 per μm, preferably at least 0.015 per μm, which is obtained by increasing the trimethylsilane flow at least 1% (sccm), preferably 1.5% (sccm), of the $N_2$ flow (at a constant $N_2$ flow) per deposited μm of the layer.

In one embodiment of the invention the compositional gradient is continuous in the Ti—Si—C—N layer such that the Si/(Si+Ti) atomic ratio decreases in the direction from the inner part of the layer towards the outer part of the layer which is obtained by continuously decreasing the trimethylsilane flow during the deposition. Suitably the Si/(Si+Ti) atomic ratio decreases at least 0.01 per μm, preferably at least 0.015 per μm, which is obtained by decreasing the trimethylsilane flow at least 0.5% (sccm), preferably 1.5% (sccm), of the $N_2$ flow (at a constant $N_2$ flow) per deposited μm of the layer.

In one embodiment of the invention the compositional gradient is incremental in the Ti—Si—C—N layer wherein the trimethylsilane flow is incrementally increased, or decreased, during the deposition resulting in a successive change of the average composition of the Ti—Si—C—N layer. Suitably the incremental change in trimethylsilane flow in each incremental step is >0 to 2% (sccm), preferably 0.5 to 1.5% (sccm), of the $N_2$ flow.

In one embodiment of the invention the compositional gradient is incremental wherein the Ti—Si—C—N layer comprises a sequence of at least two sublayers having different Si/(Si+Ti) atomic ratio. The gradient is obtained by increasing, or decreasing, the Si/(Si+Ti) atomic ratio of at least one of the sublayers, in the direction from the inner part of the Ti—Si—C—N layer towards the outer part of the layer, by incrementally increasing or decreasing, respectively, the trimethylsilane flow. Suitably the thicknesses of said sublayers are 1 to 100 nm.

In one embodiment of the invention the compositional gradient is incremental wherein the Ti—Si—C—N layer comprises at least two alternating sublayers having different Si/(Si+Ti) atomic ratio. The gradient is obtained by successively increasing, or decreasing, the Si/(Si+Ti) atomic ratio of at least one of said alternating sublayers by incrementally increasing or decreasing, respectively, the trimethylsilane flow. Suitably the thickness of said alternating sublayers is 1 to 100 nm. FIG. 3 shows an exemplary cutting tool according to this embodiment.

In one embodiment of the invention the compositional gradient is incremental wherein the Ti—Si—C—N layer comprises at least two alternating sublayers having different Si/(Si+Ti) atomic ratio. The gradient is obtained by successively increasing, or decreasing, the thickness of at least one of said alternating sublayers by successively increasing or decreasing, respectively, the deposition time for said at least one sublayer. Suitably the thickness of said alternating sublayers is 1 to 100 nm. FIG. 2 shows an exemplary cutting tool according to this embodiment.

In one embodiment of the invention the compositional gradient is incremental wherein the Ti—Si—C—N layer comprises two alternating sublayers, c and d, having different Si/(Si+Ti) atomic ratio. The gradient is obtained by successively increasing the Si/(Si+Ti) atomic ratio or the thickness of sublayer c or d, or decreasing the Si/(Si+Ti) atomic ratio or the thickness of sublayer c or d. Suitably said sublayer c has an average Si/(Si+Ti) atomic ratio of >0 to 0.07, obtained by using a trimethylsilane flow of >0 up to 10% (sccm) of the $N_2$ flow, and sublayer d has an average Si/(Si+Ti) atomic ratio >0.07 to 0.20, obtained by using a trimethylsilane flow of >10% up to 20% (sccm) of the $N_2$ flow, respectively.

EXAMPLE 1

Samples 1-5(comparative)

Cemented carbide inserts of ISO-type CNMG120408 for turning, consisting of 10 wt-% Co, 0.39 wt-% Cr and balance WC with a hardness of 1600 HV3, were cleaned and subjected to a PVD coating process according to the following. The inserts were loaded into a reactive arc evaporation type PVD equipment chamber containing four metal evaporation sources, arranged in two pairs. The inserts were further subjected to a three-fold rotation in order to coat them homogeneously. The evaporation sources had all Ti targets. The chamber was evacuated, followed by the steps of heating and plasma etching in order to further clean the tools, and to condition their surfaces by removing excess binder phase from the insert surface. By metal evaporation whilst maintaining a partial pressure of nitrogen in the coater a thin TiN adhesion layer was deposited at a temperature of 450° C. Next a wear resistant Ti—Si—C—N layer was deposited by arc evaporation of four Ti targets in a mixed Argon, Nitrogen and Trimethylsilane atmosphere. Argon was introduced in the process to avoid poisoning of the Ti-targets. It was found that an Argon flow of about 100-400 sccm was favourable, even though the process worked satisfactory also with zero Argon flow. The substrate bias level was chosen to obtain dense coatings with low compressive stresses. The deposition temperature of the wear resistant layer was 450° C. The details are given in Table 1.

TABLE 1

Samples 1-5 (comparative)

| Sample | Time [min.] | Bias [V] | Ar [sccm] | $N_2$ [sccm] | Trimethylsilane [sccm] |
|---|---|---|---|---|---|
| 1 | 120 | −75 | 300 | 700 | 42 |
| 2 | 120 | −90 | 100 | 700 | 125 |
| 3 | 120 | −75 | 300 | 700 | 62 |
| 4 | 120 | −75 | 300 | 700 | 83 |
| 5 | 150 | −75 | 100 | 700 | 66 |

The results of the analyses of the different coatings are shown in Table 2.

The Si/(Si+Ti) and C/(C+N) ratios were determined by Electron Probe Micro Analysis (EPMA). The average chemical composition was determined by EPMA using a JEOL JXA-8900R equipped with wavelength dispersive spectrometers at an acceleration voltage of 10 kV and a 10 nA probe current. Ti, Si and C contents were obtained by analysis while the N content was estimated by the difference between the sum of measured Ti, Si and C contents and 100 percent. The measurements were performed at the clearance side of the insert within 2 mm from the cutting edge.

X-ray diffraction technique, more specifically the $\sin^2\psi$ method (I. C. Noyan, J. B. Cohen, Residual Stress Measurement by Diffraction and Interpretation, Springer-Verlag, New York, 1987 (pp 117-130)), was used for determining the residual stress in the wear resistant layer.

A CSEM nano hardness tester was used to determine the hardness of the coatings. By using a load of 50 mN the contribution from the substrate was regarded as very small or none for all coatings.

The crater and flank wear resistance were measured in two different turning applications.

In the first test the crater wear resistance was evaluated. In this test the working material was a ball bearing steel. The cutting speed was 160 m/min. The feed was 0.3 mm/rev. and the cutting depth was 2.0 mm. The life time is defined as minutes in cut until the crater area becomes large enough to reach the cutting edge.

In the second test the flank wear resistance was evaluated. In this case a nodular cast iron was used as working material. The cutting speed was 200 m/min. The feed was 0.1 mm/rev. and the cutting depth was 2.0 mm. The time in cut was 2 minutes. After that the insert was examined on the flank face and proportion of the cutting edge which was worn through was determined.

TABLE 2

Results Samples 1-5 (comparative)

| Sample | Thickness [μm] | Si/(Si + Ti) Ratio | C/(C + N) Ratio | Residual stress [GPa] | Crater Wear [minutes] | Flank Wear [%] |
|---|---|---|---|---|---|---|
| 1 | 3.5 | 0.049 | 0.151 | −1.4 | 23 | 75 |
| 2 | 2.6 | 0.216 | 0.173 | −0.1 | 7 | 0 |
| 3 | 3.3 | 0.089 | 0.147 | −0.7 | 21 | 0 |
| 4 | 3.2 | 0.110 | 0.177 | +0.3 | 13 | 0 |
| 5 | 4.7 | 0.096 | 0.157 | −2.5 | 24 | 0 |

Sample 6-7 (invention)

Inserts of the same composition and ISO-type as for Sample 1-5 were cleaned and subjected to a PVD coating process as described in Samples 1-5. By metal evaporation whilst maintaining a partial pressure of nitrogen in the coater a thin TiN adhesion layer was deposited at a temperature of 450° C. Next a wear resistant TiSiCN layer was deposited by arc evaporation of four Ti targets in a mixed Argon, Nitrogen and Trimethylsilane atmosphere. The deposition temperature of the wear resistant layer was 450° C. The Ar flow was 300 sccm and the $N_2$ flow was 700 sccm. The substrate bias was −75 V. For Sample 6 the Trimethylsilane flow was not constant through out the coating as in Samples 1-5. It was instead continuously increased from 33 sccm to 100 sccm, resulting in a Si and C gradient with a low Si and C content close to the adhesion layer and a higher Si and C content at the surface of the coating. For Sample 7 it was the other way around. The Trimethylsilane flow was decreased from 100 sccm to 32 sccm, resulting in a Si and C gradient with a high Si and C content close to the adhesion layer and a lower Si and C content at the surface of the coating. Samples 6 and 7 are described in Table 3.

TABLE 3

Samples 6-7 (invention)

| Sample | Time [min.] | Bias [V] | Ar [sccm] | $N_2$ [sccm] | Trimethylsilane [sccm] |
|---|---|---|---|---|---|
| 6 | 150 | −75 | 300 | 700 | 33 to 100 |
| 7 | 150 | −75 | 300 | 700 | 100 to 32 |

Samples 6-7 were subjected to the same machining tests as samples 1-5.

Table 4 summarizes the thicknesses and results of the performance tests for Samples 6-7.

TABLE 4

Results Samples 6-7 (invention)

| Sample | Thickness [μm] | Si/(Si + Ti) Ratio (average) | C/(C + N) Ratio (average) | Residual stress [GPa] | Crater Wear [minutes] | Flank Wear [%] |
|---|---|---|---|---|---|---|
| 6 | 4.3 | 0.08 | 0.09 | −2.4 | 20 | 0 |
| 7 | 4.1 | 0.08 | 0.09 | −2.5 | 30 | 0 |

The Samples 6-7 in Table 4 show that it is possible to obtain for the same coating a both superior crater and flank wear resistance when the deposition parameters are selected according to the present invention.

Samples 8-9 (prior art)

Inserts of the same composition and ISO-type as for Sample 1-7 were cleaned and subjected to a PVD arc coating process using Ti85Si15 targets in an atmosphere of $N_2+C_2H_2+Ar$.

The depositions conditions are summarized in Table 5.

TABLE 5

Samples 8-9 (prior art)

| Sample | Time [min.] | Bias [V] | Ar [sccm] | $N_2$ [sccm] | $C_2H_2$ [sccm] |
|---|---|---|---|---|---|
| 8 | 150 | −75 | 300 | 700 | 50 |
| 9 | 150 | −75 | 300 | 700 | 20 |

Table 6 summarizes the results for Samples 8-9.

TABLE 6

Results Samples 8-9 (prior art)

| Sample | Thickness [μm] | Si/(Si + Ti) Ratio (average) | C/(C + N) Ratio (average) | Residual stress [GPa] | Crater Wear [minutes] | Flank Wear [%] |
|---|---|---|---|---|---|---|
| 8 | 2-3* | 0.12 | 0.23 | −4.5 | —** | —** |
| 9 | 2-3* | 0.09 | 0.11 | −4.4 | —** | —** |

*Estimated. Due to excessive spontaneous flaking the thickness could not be determined.
**Not evaluated.

The resulting coatings were extremely brittle and showed spontaneous flaking, which was attributed to the high compressive residual stress. Relevant turning tests to determine crater wear and flank wear could not be performed due to the poor adhesion of the coatings.

Sample 10-11 (prior art)

Cemented carbide inserts of the same composition and ISO-type as for Samples 1-9 were coated according to two different coating schemes.

Sample 10, being a commercially available state of the art grade particularly for applications demanding high crater wear resistance, such as turning of steel, was coated with a 4.1 μm PVD lamella layers with alternating layers of TiN and $Al_{0.5}Ti_{0.5}N$. The thickness of each individual TiN or $Al_{0.5}Ti_{0.5}N$ layer was 0.1-20 nm. The average composition of the multilayer was $Al_{0.15}Ti_{0.85}N$ measured with SEM-EDS.

Sample 11, being a commercially available state of the art grade particularly for hard work materials, such as HRSA and Inconel, was coated with a 3.9 μm PVD coating with composition $Al_{0.67}Ti_{0.33}N$ as measured by SEM-EDS.

Samples 10 and 11 were subjected to the same two machining tests as Samples 1-9 and the results are shown in Table 7.

TABLE 7

Results Samples 10 and 11 (Prior art)

| Sample | Crater Wear [minutes] | Flank Wear [%] |
|---|---|---|
| 10 | 21 | 100 |
| 11 | 6 | 0 |

Samples 10 and 11 represent cutting tool inserts particularly developed for applications demanding high crater wear resistance and high resistance to flank wear, respectively, which is also confirmed by the above results. Comparing these results with the results of embodiments of the invention according to Samples 6-7, Table 4, clearly shows the remarkable effect, wherein both high resistance to crater wear and high resistance to flank wear is combined in a single cutting tool.

The invention claimed is:

1. A cutting tool for metal machining comprising a cutting tool substrate of cemented carbide, cermet, ceramics or a super hard material, and a wear resistant coating, wherein the wear resistant coating comprises a PVD Ti—Si—C—N layer with a compositional gradient, and said PVD Ti—Si—C—N layer has an average Si/(Si+Ti) atomic ratio of 0.05 to 0.15, and a residual stress of −3.0 GPa, compressive stress, up to +0.5 GPa, tensile stress.

2. A cutting tool according to claim 1 wherein said PVD Ti—Si—C—N layer has an average C/(C+N) atomic ratio of 0.05 to 0.20.

3. A cutting tool according to claim 1 wherein said cutting tool substrate is of cemented carbide.

4. A cutting tool according to claim 1 wherein said tool is a cutting tool insert.

5. A cutting tool according to claim 1 wherein said tool is a solid drill, a milling cutter or a threading tap.

6. Method of making a cutting tool for metal machining comprising:
   depositing onto a cutting tool substrate of cemented carbide, cermet, ceramics or a super hard material, a PVD Ti—Si—C—N layer with a compositional gradient using arc evaporation with one or more Ti targets and a reactive gas atmosphere comprising a flow of trimethylsilane gas, and
   continuously or incrementally changing the flow of the trimethylsilane gas during the deposition process.

7. Method of making a cutting tool according to claim 6 wherein the trimethylsilane gas is the sole source of Si in the deposition process.

8. Method of making a cutting tool according to claim 6 wherein the compositional gradient in the Ti—Si—C—N layer is continuous such that the Si/(Si+Ti) atomic ratio decreases continuously in the direction from the inner part of the layer towards the outer part of the Ti—Si—C—N layer, by continuously decreasing the trimethylsilane flow during the deposition process.

9. Method of making a cutting tool according to claim 8 wherein said Si/(Si+Ti) atomic ratio decreases at least 0.01 per pm.

10. Method of making a cutting tool according to claim 6 wherein the compositional gradient in the Ti—Si—C—N layer is continuous such that the Si/(Si+Ti) atomic ratio increases continuously in the direction from the inner part of the layer towards the outer part of the layer, by continuously increasing the trimethylsilane flow during the deposition.

11. Method of making a cutting tool according to claim 10 wherein said Si/(Si+Ti) atomic ratio increases at least 0.01 per μm.

12. Method of making a cutting tool according to claim 6 wherein the compositional gradient is incremental in the Ti—Si—C—N layer and wherein the trimethylsilane flow is incrementally increased, or decreased, during the deposition resulting in a successive change of the average composition of the Ti—Si—C—N layer.

13. Method of making a cutting tool according to claim 12 wherein the compositional gradient is incremental, the Ti—Si—C—N layer comprises at least two alternating sublayers having different Si/(Si+Ti) atomic ratio and obtaining the gradient by successively increasing, or decreasing, the thickness of at least one of said alternating sublayers by successively increasing or decreasing, respectively, the deposition time for said at least one sublayer.

14. Method of making a cutting tool according to claim 13 wherein the thickness of said alternating sublayers is configured to be 1 to 100 nm.

15. Method of making a cutting tool according to claim 13 wherein one of said alternating sublayers has an average Si/(Si+Ti) atomic ratio of larger than 0 to 0.07.

16. Method of making a cutting tool according to claim 6 wherein the thickness of said PVD Ti—Si—C—N layer is configured to be 2 to 7 μm.

* * * * *